(12) United States Patent
Anderson et al.

(10) Patent No.: US 7,039,897 B2
(45) Date of Patent: May 2, 2006

(54) MODELING A TARGET SYSTEM BY INTERPOLATING

(75) Inventors: Eric Anderson, Palo Alto, CA (US); John Wilkes, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 762 days.

(21) Appl. No.: 10/193,163

(22) Filed: Jul. 12, 2002

(65) Prior Publication Data

US 2004/0010501 A1 Jan. 15, 2004

(51) Int. Cl.
G06F 9/44 (2006.01)
(52) U.S. Cl. .................. 717/104; 717/106; 717/102; 707/3; 707/102; 707/103 Y
(58) Field of Classification Search .............. 717/104, 717/102, 117, 101, 106; 709/204; 719/321; 707/100, 200, 102, 103 Y
See application file for complete search history.

(56) References Cited

U.S. PATENT DOCUMENTS

| | | | | |
|---|---|---|---|---|
| 5,287,511 A | * | 2/1994 | Robinson et al. | 717/106 |
| 5,610,828 A | * | 3/1997 | Kodosky et al. | 716/11 |
| 5,841,796 A | * | 11/1998 | Snyder, Jr. | 714/794 |
| 5,978,582 A | * | 11/1999 | McDonald et al. | 717/104 |
| 5,999,190 A | * | 12/1999 | Sheasby et al. | 345/589 |
| 5,999,933 A | * | 12/1999 | Mehta | 707/100 |
| 6,157,900 A | * | 12/2000 | Maseeh | 703/2 |
| 6,199,068 B1 | * | 3/2001 | Carpenter | 707/100 |
| 6,208,738 B1 | * | 3/2001 | Goldenfeld et al. | 380/287 |
| 6,286,005 B1 | * | 9/2001 | Cannon | 707/100 |
| 6,550,057 B1 | * | 4/2003 | Bowman-Amuah | 717/126 |
| 6,560,647 B1 | * | 5/2003 | Hafez et al. | 709/224 |
| 6,601,234 B1 | * | 7/2003 | Bowman-Amuah | 717/108 |
| 6,606,638 B1 | * | 8/2003 | Tarin | 707/200 |
| 6,615,253 B1 | * | 9/2003 | Bowman-Amuah | 709/219 |
| 6,618,798 B1 | * | 9/2003 | Burton et al. | 711/202 |
| 6,643,712 B1 | * | 11/2003 | Shaw et al. | 719/321 |
| 6,735,734 B1 | * | 5/2004 | Liebetreu et al. | 714/775 |
| 6,801,879 B1 | * | 10/2004 | Chretinat | 702/189 |
| 6,856,319 B1 | * | 2/2005 | Rose et al. | 345/474 |
| 6,988,109 B1 | * | 1/2006 | Stanley et al. | 707/103 Y |

OTHER PUBLICATIONS

TITLE: A Population Analysis for Hierarchical Data Structure, author: Nelson et al, ACM, 1987.*

* cited by examiner

Primary Examiner—Chameli C. Das

(57) ABSTRACT

In a method of modeling a target system, a data structure is populated with points, where each point includes at least one target value associated with at least one system parameter value of the target system. The data structure is searched with at least one inquiry parameter value. A return value is interpolated for at least one inquiry parameter value based on the points.

65 Claims, 7 Drawing Sheets

| | 205 | 210 | 215 | 220 | 225 | 230 |
|---|---|---|---|---|---|---|
| 201 | REQUEST TYPE | REQUEST SIZE | A MEASURE OF SEQUENTIALITY | AVERAGE QUEUE LENGTH | MAX REQUEST RATE | ... |
| 235a | R | 20 k | 23.7 | 2.7 | 3 | ... |
| 235b | W | 10 k | 1.15 | 4.0 | 7 | ... |
| | ... | ... | ... | ... | ... | ... |
| 235n | R | 15 k | 7.9 | 1.2 | 6.8 | ... |

MODELING A TARGET SYSTEM BY INTERPOLATING

FIELD OF THE INVENTION

This invention relates generally to modeling, in particular, modeling a target system by interpolating.

DESCRIPTION OF THE RELATED ART

Modern microprocessor technology is advancing at incredible rates. Although the storage densities of storage systems have also been increasing rapidly, performance improvements have been occurring more slowly at approximately seven to ten percent compounded annually over the last decade. As a result, storage system performance is becoming a more important factor in overall computing system behavior.

Performance models may be used to compare alternative approaches in storage system designs. The models are often of relatively high fidelity in order to give confidence to the conclusions of the models. Otherwise, assumptions based on inaccuracies can lead to erroneous conclusions.

One approach to modeling storage systems is to use an analytical performance model of the storage system. In this approach, performance attributes or parameters are typically mathematically modeled. In addition, an analytical engine integrates the individual attributes together into a model of a selected storage system, where the model takes in workload summaries to estimate performance. Accordingly, analytic models of storage systems may be very accurate.

However, the analytic model approach may have some disadvantages and drawbacks. For instance, the analytic model approach may require a user to have extensive knowledge of the behavior of the selected storage system. Accordingly, developing the analytic model may require a substantial length of time and effort to model the selected storage system correctly. Moreover, it may be wildly wrong if the analytic model misunderstands (or misestimates) a parameter.

Another approach to modeling storage systems is to use input/output (I/O) simulation. In I/O simulation, performance characteristics of storage systems are simulated on a per I/O basis rather than using a summary of the workload. A more accurate model of the storage system may be created since the storage system is modeled more precisely and at an individual I/O level. However, this approach may also have drawbacks and hindrances. For example, it may take much longer to simulate sufficiently many I/Os to produce an accurate-enough answer, which may be problematic if the modeling conclusions are needed quickly.

SUMMARY OF THE INVENTION

One embodiment of the invention relates to a method of modeling a target system. The method includes populating a data structure with points, where each point comprises at least one target value associated with at least one system parameter value of the target system. The method also includes searching the data structure with at least one inquiry parameter value and interpolating a return value for the at least one inquiry parameter valuebased on the points.

Another embodiment of the invention pertains to a method of determining points for use in modeling system characteristics. The method includes instantiating a data structure with zero or more initial points and selecting at least one target inquiry value. The method also includes determining a point for the at least one target inquiry value and inserting the point into the data structure. Yet another embodiment of the invention relates to an apparatus for modeling a target system. The apparatus includes means for populating a data structure with points, where each point comprises at least one system parameter value and at least one target value. The apparatus also includes means for searching the data structure with at least one inquiry parameter value and means for interpolating a return value for the at least one inquiry parameter valuebased on the points.

Yet another embodiment of the invention relates to an apparatus for modeling a target system. The apparatus includes means for instantiating a data structure with points associated with the target system and means for selecting one or more target inquiry values based on a rule. The apparatus also includes means for determining a respective point using the one or more system parameter values and means for adding a value associated with said respective point to the data structure.

Yet another embodiment of the invention pertains to a system for modeling characteristics of a target system. The system includes a memory, at least one processor, an interpolation module and a data structure. The interpolation module is configured to be stored in the memory and executed by the at least one processor. The data structure is configured to be stored in the memory and searched by inquiry parameter values related to the target system. The interpolation module is configured to populate the data structure with points, where each point comprises at least one system parameter value and at least one target value. The interpolation module is also configured to search the data structure with the inquiry parameter values and to interpolate a return value based on the points.

Yet another embodiment of the invention relates to an apparatus for populating a data structure adapted to model a target system. The apparatus includes a memory, at least one processor, an interpolation module and a populator module. The interpolation module is configured to be stored in the memory and executed by the at least one processor, where the interpolation module is configured to instantiate a data structure. The populator module is configured to add points associated with the target system to the data structure, where each point includes at least one system parameter value and at least one associated target value. The populator module is also configured to select at least one target inquiry value to determine a point based on at least one target inquiry value set and to add the point to the data structure.

BRIEF DESCRIPTION OF THE DRAWINGS

Various features of the present invention can be more fully appreciated as the same become better understood with reference to the following detailed description of the present invention when considered in connection with the accompanying figures, in which:

FIG. 2 illustrates an exemplary embodiment of the data structure shown in FIG. 1 in accordance with an embodiment of the present invention;

DETAILED DESCRIPTION

Figure 1:
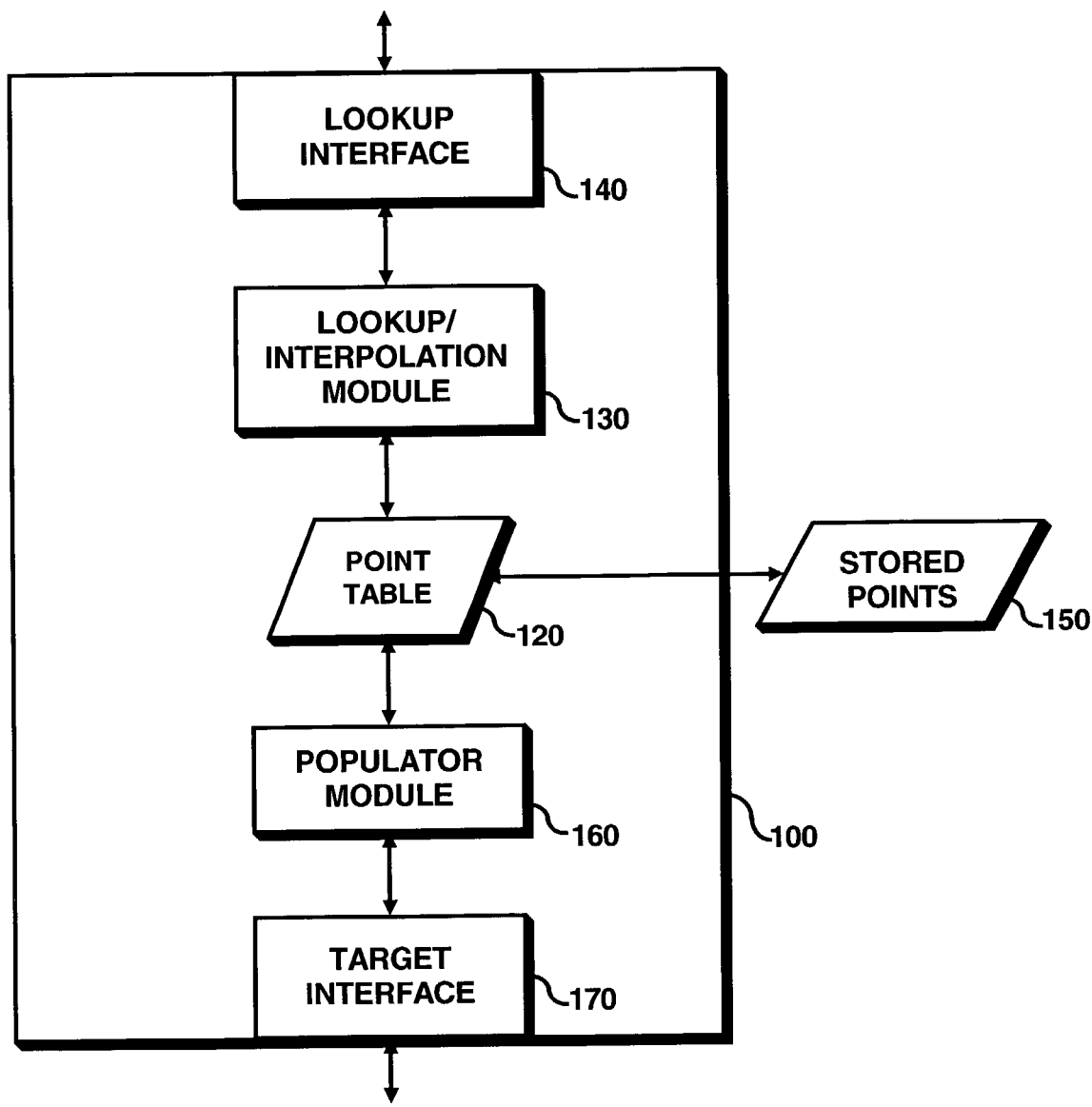
FIG. 1 illustrates an exemplary block diagram of an estimator system in accordance with an embodiment of the present invention.

In the following detailed description, numerous specific details are set forth in order to provide a thorough understanding of the present invention. However, it will be apparent to one of ordinary skill in the art that these specific details need not be used to practice the present invention. In other instances, well known structures, interfaces, and processes have not been shown in detail in order not to unnecessarily obscure the present invention. Moreover, in the following detailed description, references are made to the accompanying figures, which illustrate specific embodiments in which the present invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

In accordance with an embodiment of the present invention, an estimator system may be configured to construct (or instantiate) a data structure, e.g., a point table, for storing target values and system parameters values associated with a target system, i.e., points. The system parameters describe the target system and may vary from a single parameter to a large number of parameters depending on the complexity of the target system. Each point comprises at least one system parameter value and at least one target value. Any of the individual system parameter values and target values may be a collection of values, such as a set, an array, or a histogram.

The data structure may be populated with a number of points, where the number may range from zero to a user-specified upper limit. The points may be retrieved from a file, a database, other modules, etc. The points, for example, may be the result of a measurement operation for a given set of system parameter values for a target system. More particularly, if the target system is a storage system, the system parameters may be request type (e.g., read, write, seek, etc.), request size (e.g., the amount of data to read and/or write), a measure of sequentiality, an average queue length, a mean seek distance, a total used disk capacity, a cache hit rate, a RAID level, a cache size, a configuration identifier, etc. The data structure may also be populated with points from an analytic model, simulation model, or other type of model.

In accordance with another embodiment of the present invention, the estimator system may be configured to model a selected target system by providing a return value (e.g., throughput, response time, etc.) for at least one inquiry parameter value based on points stored in the data structure. Each inquiry parameter is typically one of the system parameters. The inquiry parameter value or values are used to search the data structure for a target value, that is associated with a particular instance of the system parameter values.

The search of the data structure may be implemented using techniques such as linear scan, a tree index, hashing, or other similar search techniques. If the search finds an existing target value in the data structure, the estimator system may then provide the existing target value as the return value. If the search of the data structure does not locate an existing target value (or even if it does), the estimator system may interpolate an estimated target value as the return value. The interpolation may use other points in the data structure, usually "nearby" points to determine the return value. During this interpolation, the estimator system may elect to bound the value of each inquiry parameter value to be within the range of values stored in the data structure for that parameter.

In order to estimate the return value, the estimator system may be configured to use a variety of interpolation techniques such as closest point, nearest neighbor averaging, hyperplane interpolation, spline/Bezier sheet interpolation, weighted least squares, etc. For interpolation techniques that require some number of nearby values, the estimator system may select a small number, j, of nearby points. The small number, j, may be user-specified, or may be set to be proportional to the number of system parameters or may be determined by some other approach.

For interpolation techniques that require a non-degenerate set of j points (e.g., a set of j points that forms a hyperplane of dimension j−1), the estimator system may sort the points in order of distance from the point representing the inquiry parameter value or values (i.e., the inquiry point) and keep adding points (excluding degenerate points), until j points are included. The distance between two points, p and q, may be defined as the standard Euclidean distance (i.e., $$\sum_{i=1}^{N}(p_1 - q_i)^2$$

for N dimensions where $p_i$ (or $q_i$) is the coordinate of p (or q) in dimension j) for numeric values. For coordinates that happen to be string or other non-numeric values, a distance of one may be set for differing values and a distance of zero for matching values.

The estimator system may determine a set of non-degenerate points in another manner. Two points may be associated with each parameter of the inquiry point. For each point in the data structure and for each parameter of the inquiry point, the data structure point value and the inquiry point value are compared. If the values are the closest seen so far, and the data structure point value is greater than (for the other associated point, less than) and the data structure point is not associated with any parameter yet, then the data structure point is associated with the inquiry point parameter, replacing any previously associated points. Previously associated points may be re-compared using the same method to determine if they should be associated with a new parameter. A non-degenerate set may now be selected from this now smaller set of associated points using the method described above.

In accordance with yet another embodiment of the present invention, the estimator system may be configured to populate the data structure, e.g., a point table, with points for modeling a particular target system. The estimator system may select at least one target inquiry value, i.e., a set of system parameter values, and determine a point based on those target inquiry values. Such a point represents a set of system parameter values for which a target value or values may be obtained and stored in the data structure. A point stored in the data structure will always have one or more target values associated with it, except when it is marked as a point for which no target values can be obtained (e.g., if the target system cannot be operated successfully with that set of system parameters).

Additionally, an attempt to measure the target system at a given set of system parameter values may result in a target return value associated with a slightly different operating point (e.g., if a target inquiry was a desired I/O rate, it may not be possible to achieve precisely that I/O rate in a measurement). If this occurs, the point stored is associated with the actual system parameters that were associated with the target values obtained.

There are many ways to select the set of target inquiry values. For example, if the valid range of the system parameter values is viewed as forming a hyper-cube, the estimator system may start by using the corners (i.e., the extreme points) of the hyper-cube as target inquiry values and add the resulting points to the data structure. The estimator system may then repeatedly select target inquiry values, determine a point, and add it to the data structure as a point. Each point may be determined from the target inquiry values using an interface to the target, or any other method for selecting, determining, predicting, or choosing such target values. The estimator system may terminate when a user-specified metric of quality is satisfied.

The estimator system may use a variety of techniques for selecting target inquiry values for use in determining points for the point table. For instance, the estimator system may select the target inquiry values uniformly or at random within the hyper-cube of the valid range of system parameter values. The estimator system may also select target inquiry values that are "not-near" existing points in the data structure. The definition of "not-near" may be a user-defined characteristic. For instance, a distance, d, may be defined as the standard Euclidean distance. A selected set of target inquiry values is "not-near" the existing points if it is at least distance d away from those other points. The estimator system may also select a number (e.g., 10–100) of random system parameter value sets and choose the set that is farthest away from all points in the data structure.

In yet another technique, the estimator system may maintain, associated with each point in the data structure, a mis-prediction error. The mis-prediction error may be defined as the relative error between a target value and the estimated target value predicted for the system parameter value set at the time the point was of inserted into the point table (i.e., the difference between the actual target value and the estimated target value that used the system parameters for the point as target inquiry values). The estimator system may then select a number of random system parameter value sets (e.g. 10–100). The estimator system may then select the system parameter set that is closest to the point in the data structure with the highest mis-prediction error. The selected point with the highest mis-prediction error may have its mis-prediction error reduced (solely for the purposes of this comparison) by a constant fraction (e.g., 0.5) from that time on in order to reduce the chances of selecting yet another nearby point. Setting the constant fraction to zero, thereby reducing the effective mis-prediction error to zero, effectively causes the associated point to be ignored in future iterations. Alternatively, other techniques may be used to select system parameter value sets for use in determining points.

The estimator system may also use a number of rules or stopping criteria to determine when to stop adding points to the data structure. The estimator system may use any number of stopping criteria (or rules) based on predetermined (or default) parameters, user-specified parameters, or combinations thereof. An example of a stopping rule based on a user-specified metric of quality may be that the k most recently added points (e.g., 10–100) have a mis-prediction error lower than a user-specified threshold, m %. Another example of a stopping rule may be an exponentially moving average (EMA) of the mis-prediction error dropping below another user-specified threshold, n %, where the EMA may be a weighted moving average for the mis-prediction error in which the weight factors are powers of a smoothing constant. Yet another rule for terminating the addition of points to terminate after some fixed number of points are added to the data structure or after a fixed amount of time. Yet another example of a rule may be to end after the relative or absolute difference (or distance, if there are multiple target values associated with each point) between a target value of each point and the target value of the next nearest point is below yet another user-specified threshold, o %. Yet another example is the mis-prediction error of a consecutive number of points is below yet another user-specified threshold, r %. Combinations thereof or other rules are within the scope and spirit of the present invention.

FIG. 1 illustrates an exemplary block diagram of an estimator system 100 in accordance with an embodiment of the present invention. As shown in FIG. 1, the estimator system 100 includes a point table 120, a lookup/interpolation module 130, a lookup interface 140, a populator module 160 and a target interface 170. It should be readily apparent to those of ordinary skill in the art that the estimator system 100 depicted in FIG. 1 represents a generalized illustration and that other components may be added or existing components may be removed or modified without departing from the spirit or scope of the present invention.

The lookup/interpolation module 130 may be configured to instantiate the point table 120 for a target system (not shown) to be studied and/or analyzed. For instance, if the target system is a storage array, the point table 120 may be instantiated with system parameters, such as request type (read or write), request size, a measure of sequentiality, average queue length, mean seek distance, a fraction of disk surface accessed, cache hit rate, and other similar workload parameters. As another example, if the target system is a router, the point table 120 may be instantiated with system parameters, such as a packet size, quality of service, destination distribution, traffic density, etc. The point table 120 may also be instantiated for a web service with system parameters, such as size of distribution requests, fractions of dynamic content, etc.

The lookup/interpolation module 130 may also be configured to populate the point table 120 with points, such as stored points 150. The stored points 150 may be retrieved from a file, a database, another module, or other similar data structure through an appropriate interface. The points may represent system parameter values and associated target values obtained on similar or previous systems that provide a basis for the modeled system, estimated points from a simulated target system, or a combination thereof.

Subsequently, the lookup/interpolation module 130 may then provide estimated target values for another program or module through the lookup interface 140. The other program may be, for example, a tool for automatically designing storage systems, a system permitting users to explore possible configurations, or a program for visualizing an existing storage systems' performance. More particularly, the other program (not shown) may forward an inquiry parameter value through the lookup interface 140 and receive a target value from the lookup interface 140.

The lookup/interpolation module 130 may then use the inquiry parameter value to search the point table 120. If the search of the point table 120 determines that a target value exists for the requested inquiry parameter value, the lookup/interpolation module 130 may provide the existing target value through the lookup interface 140 as a return value. Otherwise, if the search of the point table 120 determines that a target value does not exist for the inquiry parameter value (or even if it does), the lookup/interpolation module 130 may estimate a target value and provide the estimated target value as a return value.

The lookup/interpolation module 130 may be configured to estimate a target value for the inquiry parameter value based on points stored in the point table 120. The lookup/interpolation module 130 may use a variety of interpolation techniques to derive the requested target value such as closest point, nearest-neighbor averaging, hyperplane interpolation, spline, Bezier sheet, weighted least squares, etc. The lookup/interpolation module 130 may truncate the inquiry parameter values to be within the range of the system parameter values found in the point table 120. This may be done for a variety of reasons— e.g., in order to improve the interpolation accuracy, or to restrict the range of values that have to be represented in the data structure 120.

In another embodiment of the present invention, the estimator system 100 may be configured to add points to the point table 120. More particularly, the populator module 160 may be invoked to add points into the point table 120, using any of the methods described earlier. Selected target inquiry values may be generated by the populator module 160 or provided by a user through an appropriate interface. Selected target inquiry values may be forwarded through the target interface 170 to determine system parameter values and associated target values, i.e., a point, based on the target inquiry values. The target interface 170 may be implemented as an application program interface, a device driver, or programming entity that provides the populator module 160 with one or more points based on some system parameter values.

It should be readily apparent to those of ordinary skill in the art that the functions of the populator module 160 may be implemented by the lookup/interpolation module 130. This variation and other variations of functionality between each module in the estimator system 100 are well within the scope and spirit of the present invention. The populator module 160 may also apply a number of rules to terminate the operation of adding points, such as the rules described herein above.

FIG. 2 illustrates an embodiment of the point table 120 shown in FIG. 1 in accordance with an embodiment of the present invention. As shown in FIG. 2, row 201 denotes the labels for the system parameters of a target system (205–220) with an associated target value (225). The space denoted by label 230 may be used to include additional system parameters and/or other target values as required by a particular target system. Point table 120 represents the point table of a storage system. The system parameters include request type 205, request size 210, a measure of sequentiality 215, and average queue length 220 and the maximum request rate 225.

Each row 235*a* . . . 235*n* in the point table 120 may represent a point. Each point includes one or more system parameter values associated with one or more target values.

As the point table 120 is searched using inquiry parameter values, the point table 120 may indicate that no matching system parameter values are present (e.g., returning a null value(s) or an error). Although in FIG. 2, the point table 120 is depicted as a table, other searchable data structures, e.g., a linked-list, a hash table, etc., are contemplated and are within the scope of the present invention. Moreover, the point table 120 may be multiple data structures indexed by indices or other similar search devices.

Figure 3:
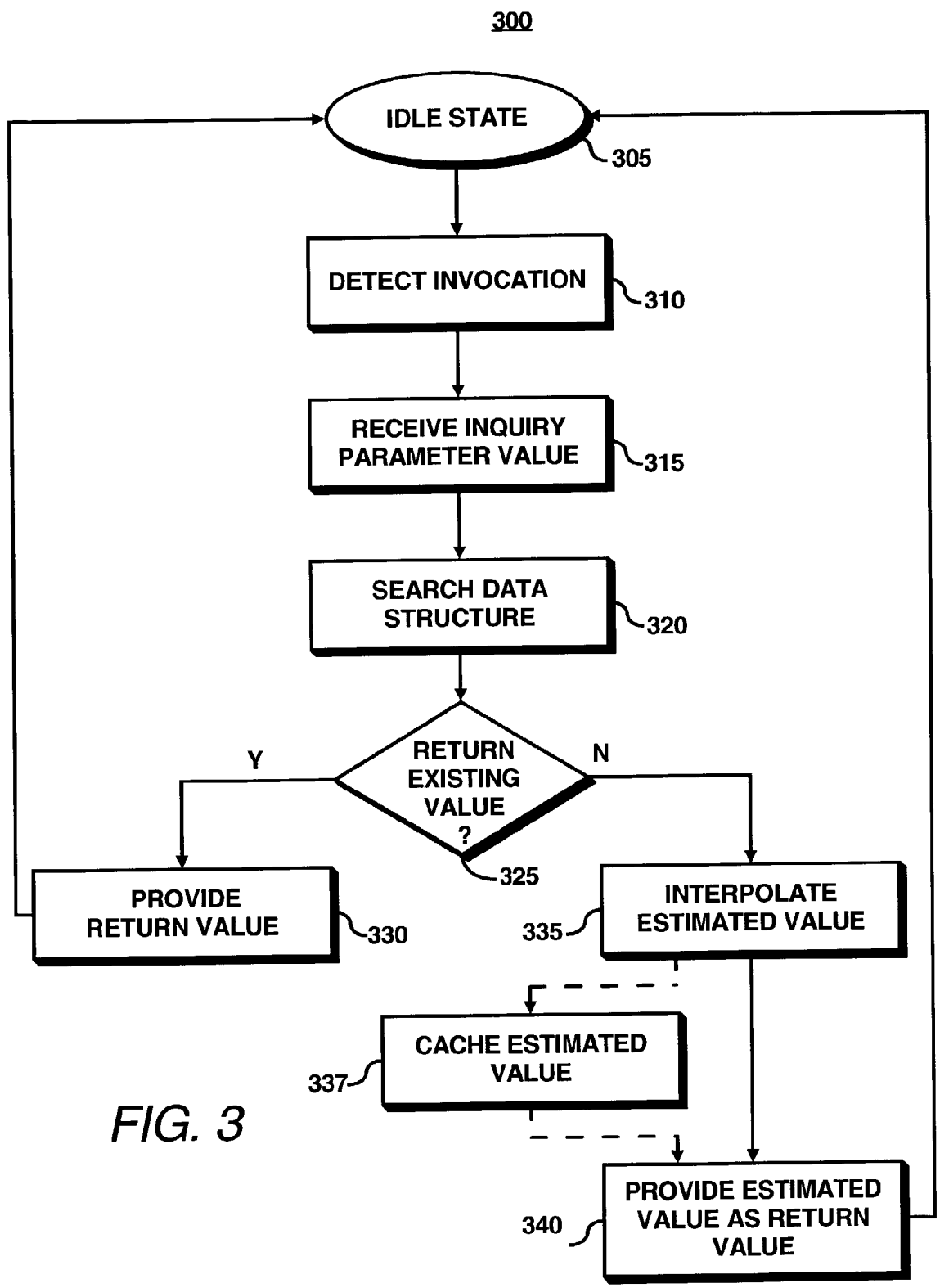
FIG. 3 illustrates a flow diagram of a mode of operation for the estimator system shown in FIG. 1 in accordance with an embodiment of the present invention.

FIG. 3 illustrates a flow diagram of a method 300 for determining return values by the lookup/interpolation module 130 shown in FIG. 1 in accordance with an embodiment of the present invention. It should be readily apparent to those of ordinary skill in the art that the method 300 depicted in FIG. 3 represents a generalized illustration and that other steps may be added or existing steps may be removed or modified without departing from the spirit or scope of the present invention.

As shown in FIG. 3, the lookup/interpolation module 130 may be configured to be in an idle state in step 305. In this embodiment of the present invention, a program (not shown) may invoke the lookup/interpolation module 130 through the lookup interface 140. It should be readily apparent to those skilled in the art that the functions of the lookup/interpolation module 130 may be invoked directly by a simulator or other performance modeling applications.

In step 310, the lookup/interpolation module 130 may detect a request through the lookup interface 140. The request may be implemented as a command, packet, signal, function call or other similar invocation method. In step 315, the lookup/interpolation module 130 may be configured to receive at least one inquiry parameter value, which may be contained in the request or may be subsequently forwarded to the lookup/interpolation module 130.

In step 320, the lookup/interpolation module 130 may be configured to utilize the at least one inquiry parameter value to search the data structure, e.g., the point table 120. If a point is found for the at least one inquiry parameter value, in step 325, the lookup/interpolation module 130 may then provide all or part of the retrieved point as a return value to the lookup interface 140, in step 330. Subsequently, the lookup/interpolation module 130 may return to the idle state of step 305. Otherwise (or even if a point is found), the lookup/interpolation module 130 may pass the at least one inquiry parameter value onto step 335 for interpolation.

In step 335, the lookup/interpolation module 130 may be configured to determine an estimated target value for at least one inquiry parameter value using interpolation techniques. For example, the lookup/interpolation module 130 may use a closest point interpolation algorithm to estimate the target value for the selected inquiry parameter value. More particularly, the lookup/interpolation module 130 may determine the Euclidean distance between the inquiry parameter value and the respective system parameter value for each point in the point table 120. The target value of the point closest to the inquiry parameter value may be the estimated target value for the requested inquiry parameter value. Alternate examples of interpolation techniques are described below. Optionally, the lookup/interpolation module 130 may be configured to cache the estimated value along with the inquiry parameter value in the data structure, in step 337. Subsequently, the lookup/interpolation module 130 provides the estimated value as the return value, in step 340, and returns to the idle state of step 305.

In another embodiment of the present invention, the lookup/interpolation module 130 may use a nearest neighbor averaging interpolation technique to estimate a desired target value for an inquiry parameter value. In this technique, a set of nearest neighbors, h, is chosen. The size of the set of nearest neighbors, h, may be a user-defined parameter whose value is usually around the number of system parameters of the target system. The contribution of each neighbor is weighted by its distance from the other neighbors, $w_i$, such that the summation of the weights $\Sigma w_i=1$, where $w_i$ is proportional to the distance of point i to the inquiry parameter value. The estimated target value for the inquiry parameter value is then the sum of the target values in the point table 120, times the respective weight.

In yet another embodiment of the present invention, the lookup/interpolation module 130 may use a hyperplane interpolation approach to estimate the target value for the inquiry parameter value. The lookup/interpolation module 130 may be configured to choose a set of nearby points that form a non-degenerate hyperplane. The lookup/interpolation module 130 may then estimate the target value for the inquiry parameter value as the value of the hyperplane at the inquiry parameter value. It should be readily apparent to those skilled in the art that other interpolation techniques could be implemented by the lookup/interpolation module 130, such as spline interpolation algorithms, Bezier sheet interpolation, etc.

Figure 4A:
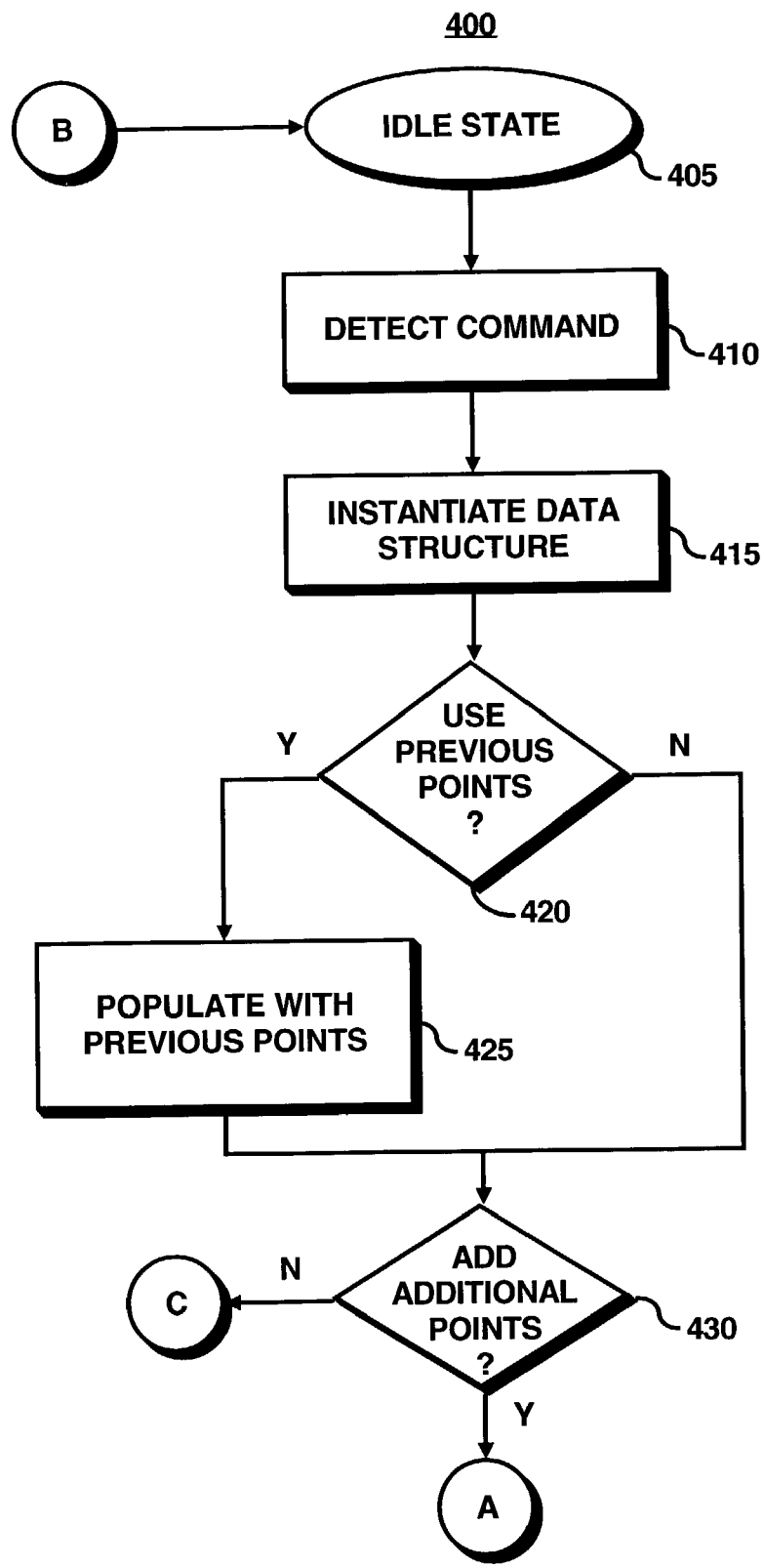
FIGS. 4A–4B collectively illustrate a flow diagram of a mode of operation for the estimator system as shown in FIG. 1 in accordance with an embodiment of the present invention.
Figure 4B:
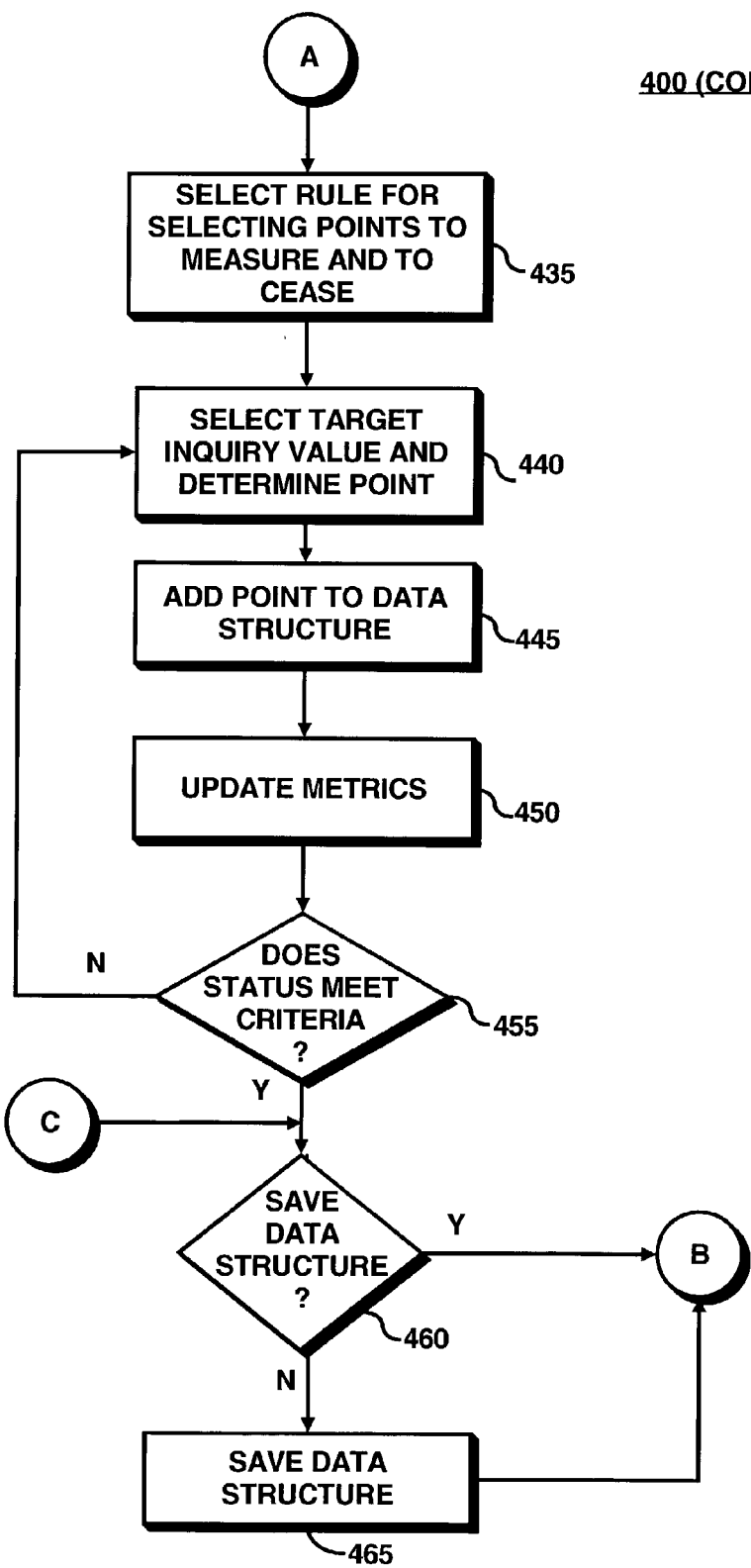

FIGS. 4A–4B collectively illustrate an exemplary flow diagram of a method 400 for populating the point table 120 shown in FIG. 1 in accordance with an embodiment of the present invention. It should be readily apparent to those of ordinary skill in the art that the method 400 depicted in FIGS. 4A–4B represents a generalized illustration and that other steps may be added or existing steps may be removed or modified without departing from the spirit or scope of the present invention.

As shown in FIG. 4A, the populator module 160 may be configured to be in an idle state, in step 405. The populator module 160 may detect a command, in step 410. The populator module 160 may instantiate the point table 120, for a particular target system in step 415. For example, if the target system is a radar system, the system parameters may include altitude, distance, direction, elevation angle, interference metrics, weather metrics, etc., and the target values may include speed of identification, target speed, target size, etc.

In step 420, the populator module 160 may determine whether to add points to the data structure from a persistent storage device or external module. For example, the populator module 160 may prompt a user with a menu option or query.

If the populator module 160 determines that the existing points are to be used, the populator module 160 may retrieve points, e.g., stored points 150, and insert the points into the instantiated data structure, in step 425. Subsequently, the lookup/interpolation module 130 may proceed to step 430.

The lookup/interpolation module 130 may determine whether new points are to be added to the data structure, in step 430. For example, the lookup/interpolation module 130 may prompt a user with a command line prompt, a dialog box, etc.

If the populator module 160 determines that no new points are to be added, the populator module 160 may proceed to the processing of step 460 (with reference to FIG. 4B), which is described in greater detail below.

Otherwise, if the populator module 160 determines that new points are to be added, the populator module 160 may provide a mechanism for a user to select a rule for selecting new system parameter values for use in retrieving points and a rule for stopping the addition of new points to the data structure, in step 435 with reference to FIG. 4B. As an example, the populator module 160 may display a dialog box of rules for a user to select. The rules for adding points and the rules for stopping the addition of points have been described previously.

In step 440, the populator module 160 selects at least one target inquiry value using the selection rule selected in step 435 and determines the associated point using the target interface 170.

In step 445, the lookup/interpolation module 130 may be configured to add (or insert) the point to the data structure. In step 450, the lookup/interpolation module 130 may be configured to update the predetermined, default, or user-specified metrics. The metrics may be used by the rule for stopping selected in step 435.

In step 455 the lookup/interpolation module 130 may be configured to determine if the status of the metric(s) meets a criterion (e.g., a default and/or a user-specified rule for stopping). The populator module 160 may return to the processing of step 440 if the status of the metric does not meet the criteria.

Otherwise, in step 460, the populator module 160 may determine whether to save the data structure. For instance, the populator module 160 may ask a user whether to save the updated data structure.

If the populator module 160 determines that the data structure is to be saved, the populator module 160 may store the data structure in a memory such as local memory of a computer system, storage or file system, a floppy disk, a flash memory or other type of persistent memory, in step 465, and subsequently return to the idle state of step 405. Otherwise, the populator module 160 may be configured to return to the idle state of step 405.

Figure 5:
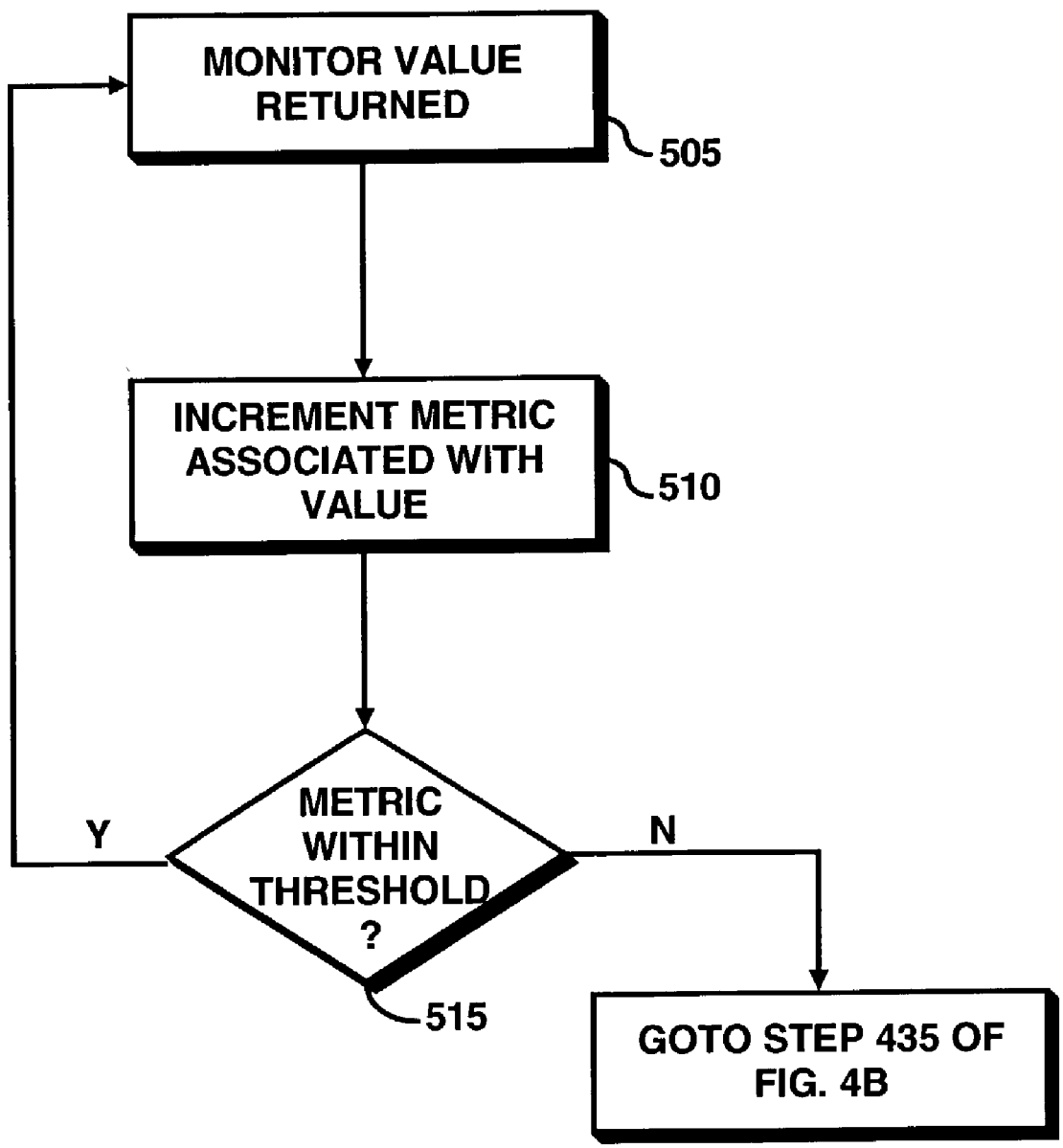
FIG. 5 illustrates a flow diagram of another mode of operation for the estimator system as shown in FIG. 1 in accordance with an embodiment of the present invention.

FIG. 5 illustrates an exemplary flow diagram of a method 500 for the lookup/interpolation module 130 as shown in FIG. 1 in accordance with an embodiment of the present invention. It should be readily apparent to those of ordinary skill in the art that the operational mode of the lookup/interpolation module 130 depicted in FIG. 5 represents a generalized illustration and that other steps may be added or existing steps may be removed or modified without departing from the spirit or scope of the present invention.

As shown in FIG. 5, the lookup/interpolation module 130 may be configured to monitor the return value generated in response to at least one inquiry parameter value for a target system as described with respect to FIG. 3, in step 505.

In step 510, the lookup/interpolation module 130 may be configured to increment a metric associated with the return value. The metric may be the number of times each point in the data structure was used to determine the return value, the mean distance between the inquiry parameter value and the closest point, the number of inquiry points within various regions covered by the point table, the number of points not found in the point table 120, etc.

In step 515, the lookup/interpolation module 130 may compare the metric with a user-specified threshold. If the metric is within the threshold, the lookup/interpolation module 130 may return to step 505 and continue monitoring the values returned.

Otherwise, if the metric exceeds the threshold, the lookup/interpolation module 130 may initiate adding points into the point table 120 based on the metric and some of the recent inquiry points. An example of the user-specified threshold may be maximum distance between an inquiry parameter value and the next nearest point in the point table. More particularly, the lookup/interpolation module 130 may invoke the populator module 160 using method 400 starting at step 435. The lookup/interpolation module 130 may specify a rule such as selecting system parameter values equal (or near) recent inquiry parameter values, or selecting a random number of system parameter value sets and choosing the set that is closest to a recent inquiry parameter value.

Figure 6:
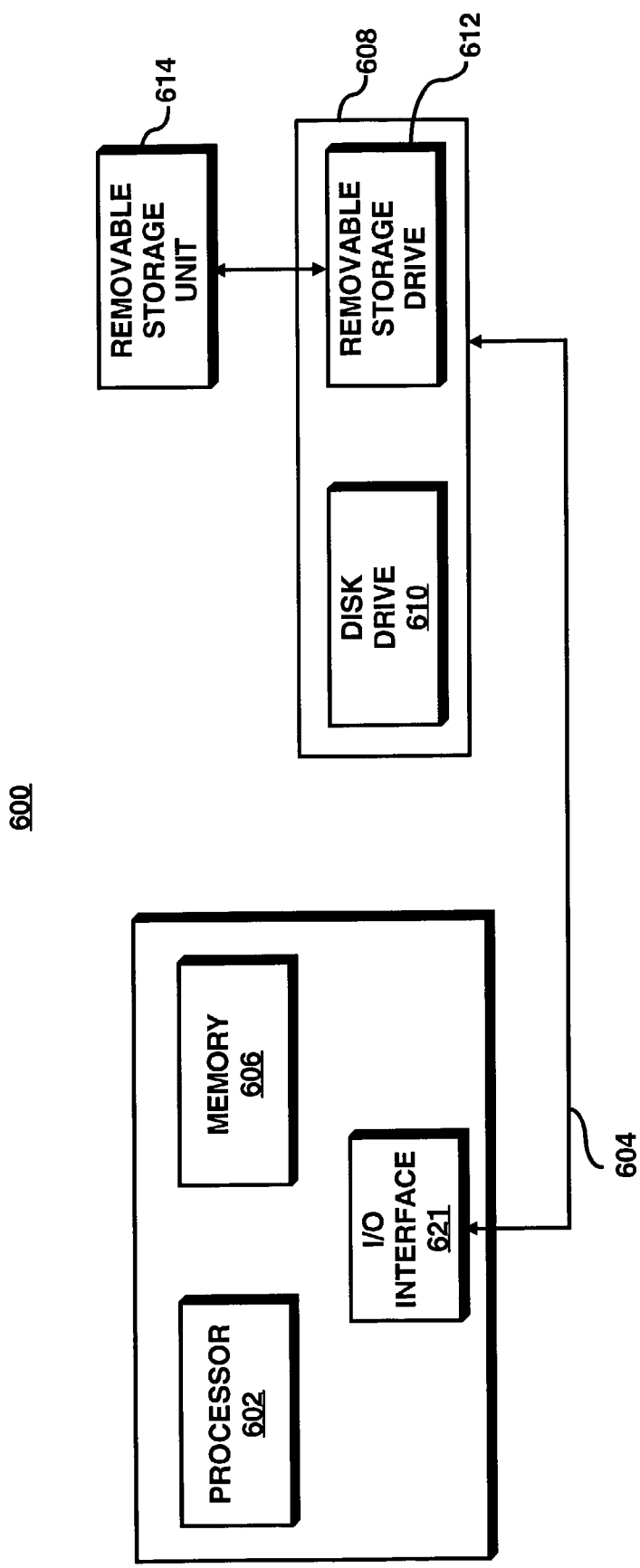
FIG. 6 illustrates a computing system where an embodiment of the present invention may be practiced.

FIG. 6 illustrates an exemplary computing system 600 where an embodiment of the present invention may be practiced. As shown in FIG. 6, the computer system 600 includes one or more processors, such as processor 602, that provide an execution platform for embodiments of the estimator system 100. Commands and data from the processor 602 are communicated over a communication bus 604. The computer system 600 also includes a memory 606, preferably Random Access Memory (RAM), where the software for the estimator system 100 may be executed during runtime, and, preferably, a secondary memory 608. The secondary memory 608 includes, for example, a hard disk drive 610 and/or a removable storage drive 612, representing a floppy diskette drive, a magnetic tape drive, a compact disk drive, etc., where a copy of a computer program embodiment for the estimator system 100 may be stored. The removable storage drive 612 reads from and/or writes to a removable storage unit 614 in a known manner. The storage system 608 is connected to the memory 606 by some interconnect such as small computer system interface or IDE bus, or a network.

It should be readily apparent to those of ordinary skill in the art that the computing system 600 depicted in FIG. 6 represents a generalized illustration and that other components may be added or existing components may be removed or modified without departing from the spirit or scope of the present invention.

A computer program may implement the modes of operations of the estimator system 100 as described herein above. The computer program can exist in a variety of forms both active and inactive. For example, the computer program and objects can exist as software comprised of program instructions or statements in source code, object code, executable code or other formats; firmware program(s); or hardware description language (HDL) files. Any of the above can be embodied on a computer readable medium, which include storage devices and signals, in compressed or uncompressed form. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of executable software program(s) of the computer program on a CD ROM or via Internet download. In a sense, the Internet itself, as an abstract entity, is a computer readable medium.

What has been described and illustrated herein is one embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A computer-implemented method of modeling a target system, said method comprising:
   populating a data structure with points, each point comprising at least one target value associated with at least one system parameter value of said target system;
   searching said data structure with at least one inquiry parameter value; and
   interpolating a return value for said at least one inquiry parameter value based on said points in response to said searching of said data structure resulting in a failure to find a point in the data structure corresponding to the at least one inquiry parameter value.

2. The method according to claim 1, wherein said at least one target value is a performance value.

3. The method according to claim 1, wherein said at least one target value is a plurality of values.

4. The method according to claim 1, wherein said interpolating of said return value uses a closest neighbor algorithm.

5. The method according to claim 1, wherein said interpolating of said return value uses a Bezier sheet interpolation algorithm.

6. The method according to claim 1, wherein said interpolating of said return value uses a hyper-plane interpolation algorithm.

7. The method according to claim 1 wherein said searching of said data structure uses one of a table look-up, a linear scan, and a tree-index.

8. The method according to claim 1, wherein said target system is a storage system and said points are measurements of said storage system.

9. The method according to claim 8, wherein said storage system is a disk array.

10. The method according to claim 1, wherein said target system is a computer system and said points are measurements of said computer system.

11. The method according to claim 1, wherein said target system is a network and said points are measurements of said network.

12. The method according to claim 1, wherein said target system is a simulated system and said points are predictions of said target system.

13. The method according to claim 1, wherein said data structure is one of an array, a table, a linked-list, and a hash table.

14. A computer implemented method of adding points, said method comprising:
   instantiating a data structure with zero or more initial points;
   selecting at least one target inquiry value;
   determining a point for said at least one target inquiry value; inserting said point into said data structure;
   returning a value in response to an inquiry into said data structure using at least one inquiry value;
   monitoring an metric associated with said inquiry;
   interpolating an additional target inquiry value in response to said metric not meeting a user-specified criterion;
   determining a respective point for said additional target inquiry value; and
   adding said respective point for said additional target inquiry value to said data structure.

15. The method according to claim 14, wherein said user-specified criterion comprises a density of points in the said data structure near the point that would be associated with said at least one inquiry value.

16. The method according to claim 14, wherein said selecting of said additional target inquiry value includes selecting a respective point in a region of low density of points stored in said data structure.

17. The method according to claim 14, wherein said user-specific criterion comprises a density of points stored in said data structure in regions where at least one target value is changing rapidly.

18. The method according to claim 14, further comprising:
selecting an additional target inquiry value to determine a point by applying a rule; and
populating said data structure with a respective point of said additional target inquiry value.

19. The method according to claim 18, further comprising:
repeating said step of selecting subsequent additional target inquiry value to determine by said rule until a predetermined number of said subsequent additional target inquiry values is reached; and
adding said respective point for each subsequent additional target inquiry value to said data structure.

20. The method according to claim 18, wherein said rule comprises selecting said additional target inquiry value randomly within a hypercube formed of said system parameter values of said initial points.

21. The method according to claim 18, wherein said rule comprises selecting said additional target inquiry value randomly until the point associated with said additional target inquiry value is not-near existing points.

22. The method according to claim 18, wherein said rule comprises selecting said additional target inquiry value by choosing a set of points that represent multiple target inquiry values, and selecting the point within said set that is farthest away from existing points.

23. The method according to claim 18, wherein said rule comprises selecting said additional target inquiry value that has an associated point close to an existing point having a high mis-prediction error.

24. The method according to claim 18 further comprising:
measuring a metric using one of a predetermined parameter and a user-specified parameter for said additional target inquiry value;
comparing said metric with a user-specified metric of quality; and
repeating said step of selecting subsequent additional target inquiry value to determine by said rule until said metric satisfies said user-specified metric of quality.

25. The method according to claim 24, wherein said repeating ceases after a user-specified number of points have been determined.

26. The method according to claim 24, wherein said metric is a number of additional target inquiry values wherein a mis-prediction error is less than a user-specified error-bound parameter, and the user-specified metric of quality is a minimum number.

27. The method according to claim 26, wherein said mis-prediction error is one of relative and absolute.

28. The method according to claim 24, wherein said metric is a number of consecutive additional system parameter values wherein a mis-prediction error is less than a user-specified error-bound parameter, and the user-specified metric of quality is a minimum number.

29. The method according to claim 24, wherein said metric is an exponentially moving average and said user-specified parameter is a factor for the exponentially moving average and the quality metric is a maximum exponentially moving average.

30. The method according to claim 24, wherein said metric is an average of a relative difference between each point and a next nearest point being less than a predetermined threshold and the quality metric is a maximum average difference.

31. The method according to claim 24, wherein said metric is an average of absolute differences between each point and a next nearest point being less than a predetermined threshold and the user-specified metric of quality is a maximum average difference.

32. The method according to claim 24, wherein said metric is elapsed time and said user-specified metric of quality is a timebound.

33. A computer apparatus for modeling a target system, said computer apparatus comprising:
means for populating a data structure with points, each point comprising at least one system parameter value and at least one target value;
means for searching said data structure with at least one inquiry parameter value; and
means for interpolating a return value for said at least one inquiry parameter value based on said points, wherein the means for interpolating is configured to interpolate the return value in response to a determination by the means for searching that a point in the data structure corresponding to the at least one inquiry parameter value has not been found.

34. The apparatus according to claim 33, wherein said means for interpolating said return value uses one of a closest neighbor algorithm, a nearest neighbor averaging algorithm, a Bezier sheet interpolation algorithm, and a hyper-plane interpolation algorithm.

35. The apparatus according to claim 33, Wherein said target system is one of a storage system, a computer system, a network, a web service, and a radar system.

36. The apparatus according to claim 35, wherein said points are measured on one of said storage system, said computer system, said network, said web service, and said radar system.

37. The apparatus according to claim 35, wherein said storage system is one of a disk drive, a tape drive, and a disk array.

38. The apparatus according to claim 33, wherein said data structure is one of a table, a linked-list, and a hash table.

39. A computer apparatus for modeling a target system, said computer apparatus comprising:
means for instantiating a data structure with points associated with said target system;
means far selecting one or more target inquiry values based on a rule;
means for determining a respective point using said one or more system parameter values;
means for adding said respective point to said data structure;
means for returning a value in response to an inquiry into said data structure using at least one inquiry value;
means for monitoring a metric associated with said inquiry;
means for interpolating an additional target inquiry value, wherein the means for interpolating is configured to interpolate the additional target inquiry value in response to said metric not meeting a user-specified criterion; and means for determining a respective point for said additional target inquiry value, and wherein the means for adding is configured to add the respective point for said additional target inquiry value to said data structure.

40. The apparatus according to claim 39, wherein said means for selecting one or more target inquiry values based on said rule further comprises means for stopping said selecting one or more inquiry values when a stopping condition is reached.

41. The apparatus according to claim 40, further comprising:
means for measuring a metric;
means for comparing said metric with a user-specified metric of quality as a stopping condition.

42. The apparatus according to claim 39, wherein said means for selecting one or more target inquiry values based on a rule further comprises means for selecting said one or more target inquiry values randomly within a hypercube formed by ranges of said system parameter values.

43. The apparatus according to claim 39, further comprising:
means for selecting said one or more target inquiry values randomly until said one or more target inquiry values is not-near existing points.

44. The apparatus according to claim 39, further comprising:
means for selecting two or more sets of said system parameter values and means for selecting a set of said system parameter values from said two or more sets of said system parameter values that is farther way from existing points.

45. The apparatus according to claim 39, further comprising:
means for selecting two or more sets of said target inquiry values and means for selecting a set of said target inquiry values from said two or more sets of said target inquiry values that is closest to a point having a highest mis-prediction error.

46. A system for modeling characteristics of a target system, said system comprising:
a memory;
at least one processor;
an interpolation module configured to be stored in said memory and executed by said at least one processor; and
a data structure configured to be stored in said memory and searched by inquiry parameter values related to said target system, wherein said interpolation module is configured to populace said data structure with points, each point comprising of at least one system parameter value and at least one target value and said interpolation module is also configured to search said data structure with said inquiry parameter values, and to interpolate a return value based on said points in response said search of said data structure resulting in a failure to find a point in the data structure corresponding to the at least one inquiry parameter value.

47. The system according to claim 46, wherein said interpolation module uses one of a closest neighbor algorithm, a nearest neighbor averaging algorithm, a Bezier sheet interpolation algorithm, and a hyper-plane interpolation algorithm to estimate said return value.

48. The system according to claim 46, wherein said target system is one of a storage system, a computer system, a network, a web service, and a radar system.

49. The system according to claim 48, wherein said points are measurements on one of said storage system, said computer system, said network, said web service, and said radar system.

50. The system according to claim 48, wherein said storage system is one of a disk drive, a tape drive, end a disk array.

51. The system according to claim 46, wherein said data structure is one of a table, a linked-list and a hash table.

52. An apparatus for populating a data structure adapted to model a target system, said apparatus comprising:
a memory; at least one processor;
an interpolation module configured to be stored in said memory and executed by said at least one processor, wherein said interpolation module is configured to instantiate a data structure; and
a populator module configured to add points associated with said target system to said data structure, each point comprising at least one system parameter value and at least one associated target value, wherein said populator module is configured to select at Least one target inquiry value to determine a point based on said at least one target inquiry value set, and to add said point to said data structure, and wherein the populator module is further configured to add a respective point corresponding to an additional target inquiry value that is not found in the data structure, wherein the additional target inquiry comprises a value interpolated by the interpolation module based upon a metric.

53. The apparatus according to claim 52, wherein said populator module is configured to apply a rule, to select an additional target inquiry value based on said rule, to determine a respective point for said additional target inquiry value, and to add said respective point to said data Structure.

54. The apparatus according to claim 52, wherein said populator module is configured to select said at least one target inquiry value randomly within a hypercube formed of a range of said system parameter values.

55. The apparatus according to claim 52, wherein said populator module is configured to select said at least one target inquiry value randomly until said at least one target inquiry value is not-near existing points.

56. The apparatus according to claim 52, wherein said populator module is configured to select said target inquiry value by choosing at least two target inquiry value sets and selecting one that is farthest away from existing points.

57. The apparatus according to claim 52, wherein said populator module is configured to select said target inquiry value by choosing at least two target inquiry value sets and selecting one that is closest to an existing point having a highest mis-prediction error.

58. The apparatus according to claim 52, wherein said populator module is configured to measure a metric using at least one of a predetermined parameter and a user-specified parameter, to compare said metric with a user-specified metric of quality, and to cease selection of said additional target inquiry values in response to said metric satisfying said user-specified metric of quality.

59. The apparatus according to claim 58, wherein said metric is a number of points wherein the mis-prediction error is less than a user-specified error parameter and the user-specified metric of quality is a minimum number.

60. The apparatus according to claim 59, wherein said metric resets to zero when to the mis-prediction error exceeds the user-specified parameter.

61. The apparatus according to claim 59, wherein said mis-prediction error is either relative or absolute.

62. The apparatus according to claim 58, wherein said metric is an exponentially moving average, the optional user-specified parameter is a factor for the exponentially moving average and the quality metric is a maximum exponentially moving average.

63. The apparatus according to claim 58, wherein said metric is a mean relative difference between a target value of each point and a target value of a next nearest point-and the quality metric is a maximum average error.

64. The apparatus according to claim 58, wherein said metric is a mean absolute difference between a target value of each point and a target value of a next nearest point.

65. The apparatus according to claim 58, wherein said metric is elapsed time and said user-specified metric of quality is time-bound.

* * * * *

UNITED STATES PATENT AND TRADEMARK OFFICE
CERTIFICATE OF CORRECTION

PATENT NO. : 7,039,897 B2  Page 1 of 1
APPLICATION NO. : 10/193163
DATED : May 2, 2006
INVENTOR(S) : Eric Anderson et al.

It is certified that error appears in the above-identified patent and that said Letters Patent is hereby corrected as shown below:

In column 4, line 40, after "where" delete "$p_i$;" and insert -- $p_1$ --, therefor.

In column 12, line 56, in Claim 14, after "monitoring" delete "an" and insert -- a --, therefor.

In column 13, line 41, in Claim 24, delete "claim 18" and insert -- claim 18, --, therefor.

In column 14, line 37, in Claim 35, delete "Wherein" and insert -- wherein --, therefor.

In column 14, line 53, in Claim 39, delete "far" and insert -- for --, therefor.

In column 15, line 51, in Claim 46, delete "populace" and insert -- populate --, therefor.

In column 16, line 6, in Claim 50, delete "end" and insert -- and --, therefor.

In column 16, line 21, in Claim 52, delete "Least" and insert -- least --, therefor.

In column 16, line 28, in Claim 52, after "inquiry" insert -- value --.

In column 16, line 34, in Claim 53, delete "Structure." and insert -- structure. --, therefor.

In column 17, line 8, in Claim 63, after "point" delete "-".

Signed and Sealed this

Sixth Day of April, 2010

David J. Kappos
*Director of the United States Patent and Trademark Office*